(12) United States Patent
Ikegami

(10) Patent No.: US 9,488,839 B2
(45) Date of Patent: Nov. 8, 2016

(54) LIGHT EMITTING DEVICE AND IMAGE DISPLAY APPARATUS

(71) Applicant: Seiko Epson Corporation, Tokyo (JP)

(72) Inventor: Tomio Ikegami, Chino (JE)

(73) Assignee: Seiko Epson Corporation (JP)

( * ) Notice: Subject to any disclaimer, the term of this patent is extended or adjusted under 35 U.S.C. 154(b) by 12 days.

(21) Appl. No.: 14/551,424

(22) Filed: Nov. 24, 2014

(65) Prior Publication Data

US 2015/0146753 A1    May 28, 2015

(30) Foreign Application Priority Data

Nov. 25, 2013 (JP) ................................ 2013-242535

(51) Int. Cl.
| | | |
|---|---|---|
| H05B 33/00 | (2006.01) | |
| G02B 27/01 | (2006.01) | |
| H01S 5/062 | (2006.01) | |

(52) U.S. Cl.
CPC ......... G02B 27/0172 (2013.01); G02B 27/017 (2013.01); H01S 5/062 (2013.01); G02B 2027/014 (2013.01)

(58) Field of Classification Search
CPC .......... H05B 33/0812; H05B 33/0815; H05B 33/0833; H05B 33/0836
USPC ........... 315/311; 359/630; 346/9; 345/77, 81
See application file for complete search history.

(56) References Cited

U.S. PATENT DOCUMENTS 4,645,919 A * 2/1987 McCaleb ............. H03K 17/941
                                                 250/205
7,433,378 B2  10/2008 Nagawa
2011/0128476 A1* 6/2011 Park ................... G02F 1/133514
                                                  349/96

FOREIGN PATENT DOCUMENTS

| JP | 06-151958 A | 5/1994 |
|---|---|---|
| JP | 2986877 B2 | 12/1999 |
| JP | 2006-310402 A | 11/2006 |
| JP | 2007-150237 A | 6/2007 |
| JP | 2010-044204 A | 2/2010 |

\* cited by examiner

*Primary Examiner* — Kevin Kim
(74) *Attorney, Agent, or Firm* — Harness, Dickey & Pierce, P.L.C.

(57) ABSTRACT

A light emitting device includes: a light emitting element; and a light variable resistive element which is connected to the light emitting element in parallel and is provided at a position which is irradiated with light emitted from the light emitting element, wherein the light variable resistive element has a characteristic in which a resistance value decreases as an amount of irradiation light increases.

13 Claims, 10 Drawing Sheets

LIGHT EMITTING DEVICE AND IMAGE DISPLAY APPARATUS

BACKGROUND

1. Technical Field

The present invention relates to a light emitting device and an image display apparatus.

2. Related Art

A head-mounted display (HMD) is known as a display apparatus which directly irradiates the retina of the eyes with laser and allows a user to visually confirm an image.

In general, the head-mounted display includes: a light emitting device which emits light; and a scanning unit which changes an optical path so that the emitted light is scanned on the retina of a user. By the head-mounted display, the user can visually confirm, for example, both a background color of the outside and the image which is drawn by the scanning unit at the same time.

However, in the head-mounted display, since the retina is irradiated with the light emitted from the light emitting device, it is necessary to consider that the retina does not get damaged by the light. In general, safety is secured by limiting an output of the light emitting device so that an amount of the light emitted from the light emitting device does not exceed regulatory limits.

In JP-A-6-151958, in order to control a light emitting output, a light emitting device which is provided with a resistor which controls a current that flows in a light emitting element is disclosed. In the light emitting device, since an element having a characteristic of increasing a temperature and a resistance value is used as the resistor, even if the temperature of the light emitting element increases by self-heating or changing of the ambient temperature, and light emitting efficiency of the light emitting element deteriorates, it is possible to increase a ratio of the current which flows in the light emitting element by making a configuration in which the current that flows in the resistor is reduced according to the temperature increase in the light emitting element. For this reason, it is possible to compensate for the deterioration of the light emitting efficiency, and to always obtain a predetermined light emitting output.

However, in the display apparatus described in JP-A-6-151958, it is possible to prevent the light emitting output from being largely deteriorated, but it is not possible to prevent the light emitting output from being largely increased. For this reason, if a failure or the like is generated on a current supply circuit, and the current becomes too high, there is a concern that the light emitting output exceeds a presumed range.

SUMMARY

An advantage of some aspects of the invention is to provide a light emitting device having a high level of safety in which an amount of light is suppressed to be equal to or less than a certain value, and an image display apparatus having a high level of safety which is provided with the related light emitting device.

The invention can be implemented as the following application examples.

Application Example 1

This application example is directed to a light emitting device including: a light emitting element; and a light variable resistive element which is connected to the light emitting element in parallel and is provided at a position which is irradiated with light emitted from the light emitting element. The light variable resistive element has a characteristic in which a resistance value decreases as an amount of irradiation light increases.

With this configuration, since an amount of light emitted from the light emitting device can be suppressed to be equal to or less than a certain value without using an electronic circuit or the like, a light emitting device having a much higher level of safety can be obtained.

Application Example 2

In the light emitting device according to the application example, it is preferable that the light variable resistive element includes an opening portion through which a part of the light emitted from the light emitting element passes.

With this configuration, while the part of the light passes through the opening portion, the light variable resistive element is irradiated with another part of the light. As a result, in the light emitting device, it is possible to emit the light and to detect the amount of light at the same time. Since it is not necessary to ensure an extra space for the light variable resistive element, the size of the device can be reduced.

Application Example 3

In the light emitting device according to the application example, it is preferable that, among the rays of light emitted from the light emitting element, a central part of the light passes through the opening portion, and the light variable resistive element is irradiated with a peripheral part of the light.

In the central part of the light, a distribution width of a wavelength is relatively narrow, and many rays of light which are close to ideal monochromatic light are included. For this reason, if the light in the central part is configured to selectively pass through the opening portion, for example, when the light emitting device is used as a light source of the image display apparatus, it is possible to enhance color reproducibility of an image.

Application Example 4

In the light emitting device according to the application example, it is preferable that the light variable resistive element has optical transparency.

With this configuration, while suppressing a decrease in the amount of the light, it is possible to change the resistance value of the light variable resistive element. For this reason, while securing safety of the light emitting device, it is possible to realize a light emitting device having a large volume of the light.

Application Example 5

In the light emitting device according to the application example, it is preferable that the light emitting element is an edge emitting type element which emits the light from both a front end surface and a rear end surface, and the light variable resistive element is provided at a position which is irradiated with the light emitted from the rear end surface.

With this configuration, since the light emitted from the front end surface is not influenced at all by the light variable resistive element, the emitted light becomes light having characteristics which are originally included in the light emitting element. For this reason, for example, a problem, such as an insufficient amount of light is unlikely to be generated, and the light emitting device contributes to realizing an image display apparatus which can display an excellent image.

Application Example 6

It is preferable that the light emitting device according to the application example further includes a detection portion which is connected to the light variable resistive element in series and detects an amount of a current which flows in the light variable resistive element.

With this configuration, since the amount of the current which flows through a line on the light emitting element side can be estimated, it is possible to indirectly assume the amount of light of the light emitting element. As a result, it is possible to easily find the amount of light of the light emitting element. In addition, when the light emitting device is embedded in the image display apparatus, in the image display apparatus, it is possible to obtain data for comparing a current value which is assigned to the light emitting device by the control portion and a current value which flows in the light emitting element in practice. For this reason, for example, it is possible to perform an inspection for confirming an integrity of the light emitting element.

Application Example 7

It is preferable that the light emitting device according to the application example further includes a temperature variable resistive element which is connected to the light variable resistive element in parallel, is provided so that heat of the light emitting element can be conducted, and has a characteristic in which the resistance value decreases as the temperature increases.

With this configuration, it is possible to particularly enhance safety of the light emitting device.

Application Example 8

This application example is directed to an image display apparatus including: a current source; and the light emitting device according to the application example.

With this configuration, the light emitting device which can suppress the amount of light emitted from the light emitting device to be equal to or less than a certain value without using the electronic circuit or the like is provided. For this reason, an image display apparatus having a much higher level of safety can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a light emitting device and an image display apparatus will be described in detail based on appropriate embodiments illustrated in attached drawings.

Image Display Apparatus

First, an embodiment of the image display apparatus according to the invention will be described.

Figure 1:
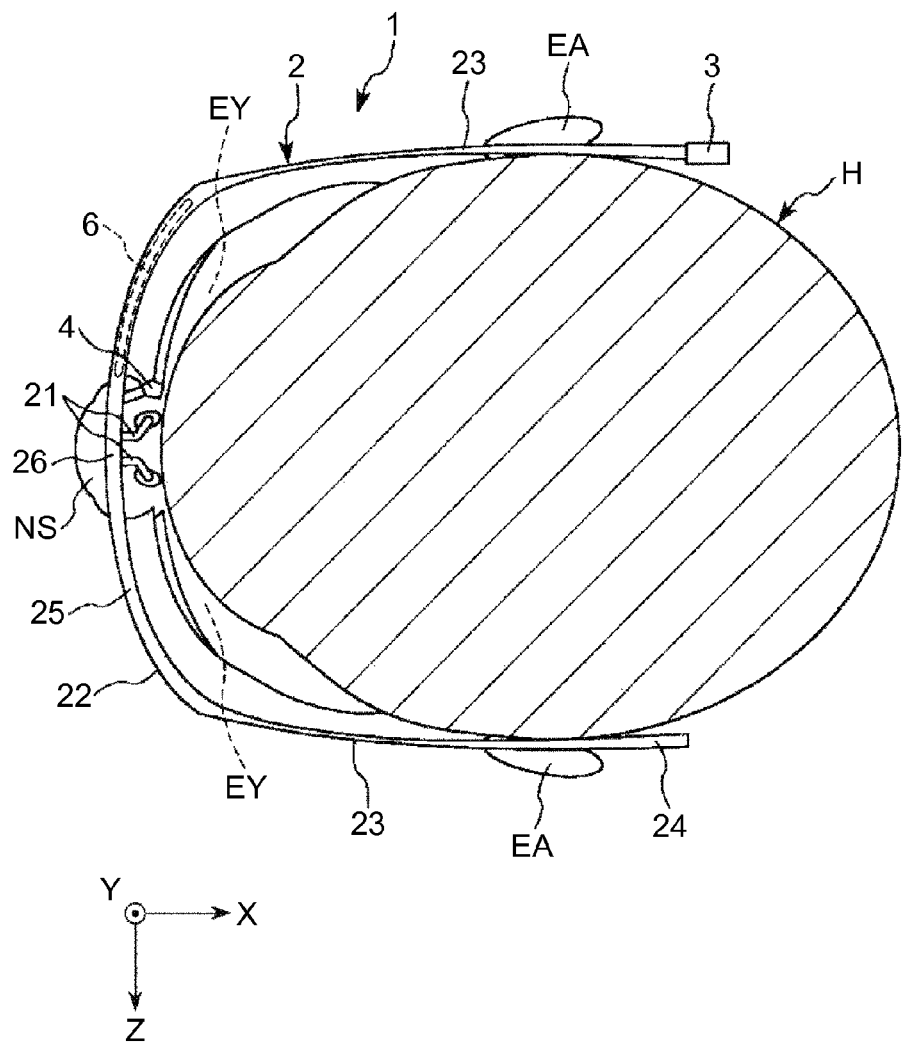
FIG. 1 is a view illustrating a schematic configuration of an embodiment (head-mounted display) of an image display apparatus according to the invention.
Figure 2:
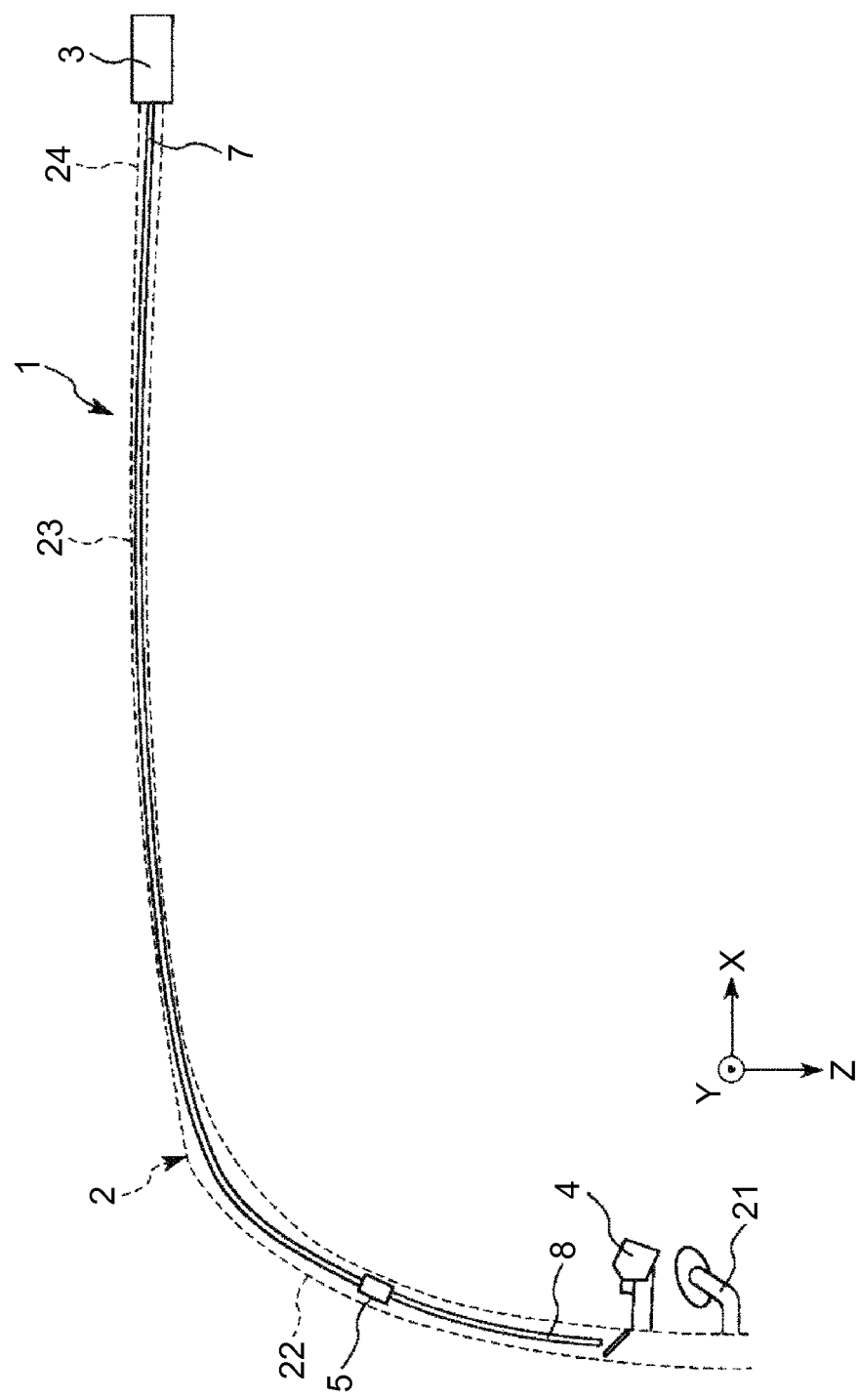
FIG. 2 is a partially enlarged view of the image display apparatus illustrated in FIG. 1.
Figure 3:
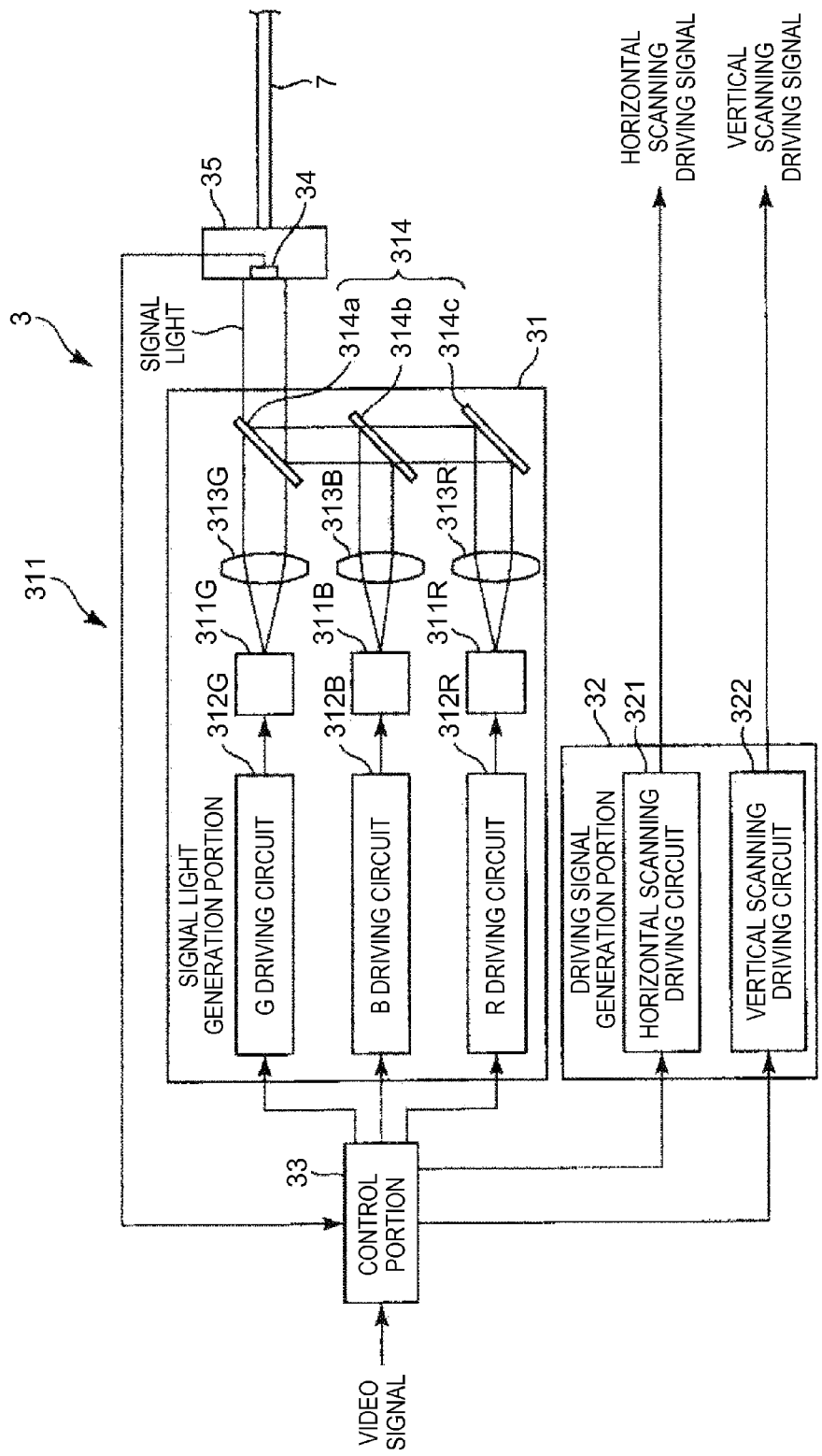
FIG. 3 is a schematic configuration view of a signal generation portion of the image display apparatus illustrated in FIG. 1.
Figure 4:
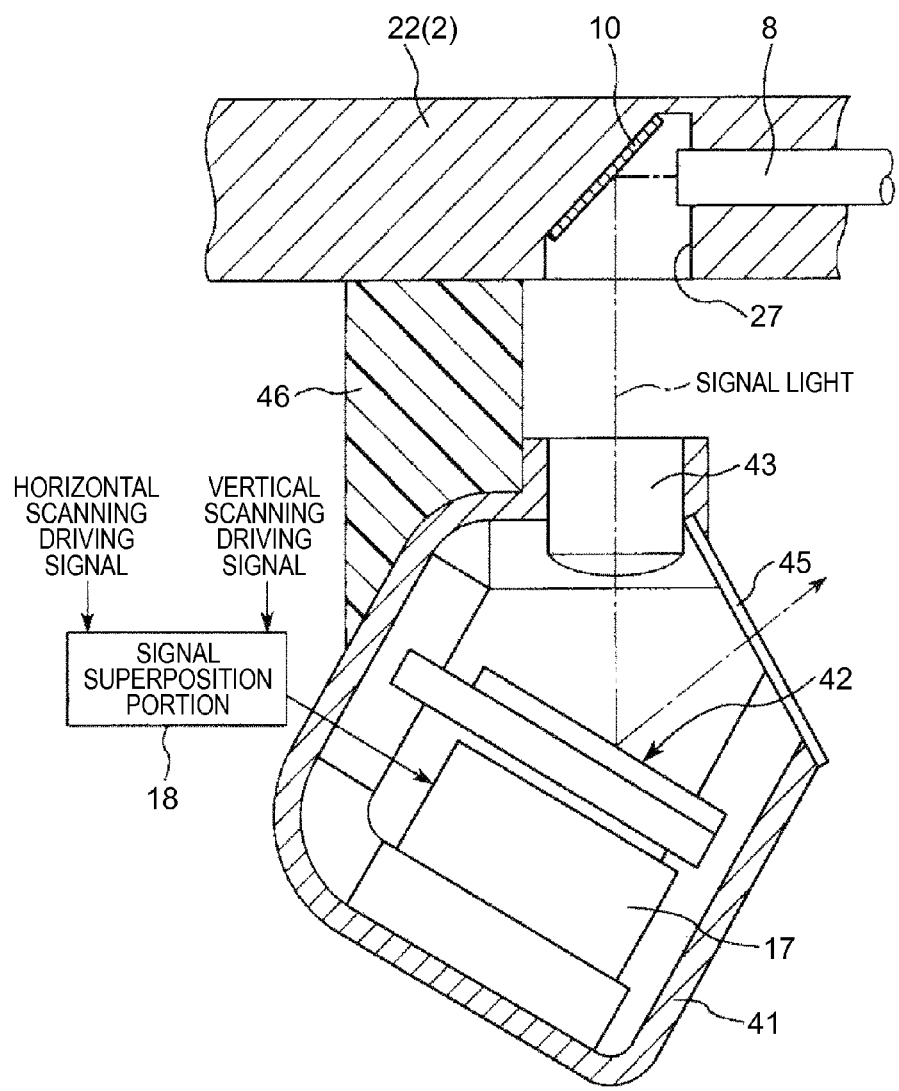
FIG. 4 is a view illustrating a schematic configuration of a light scanning portion illustrated in FIG. 1.
Figure 5:
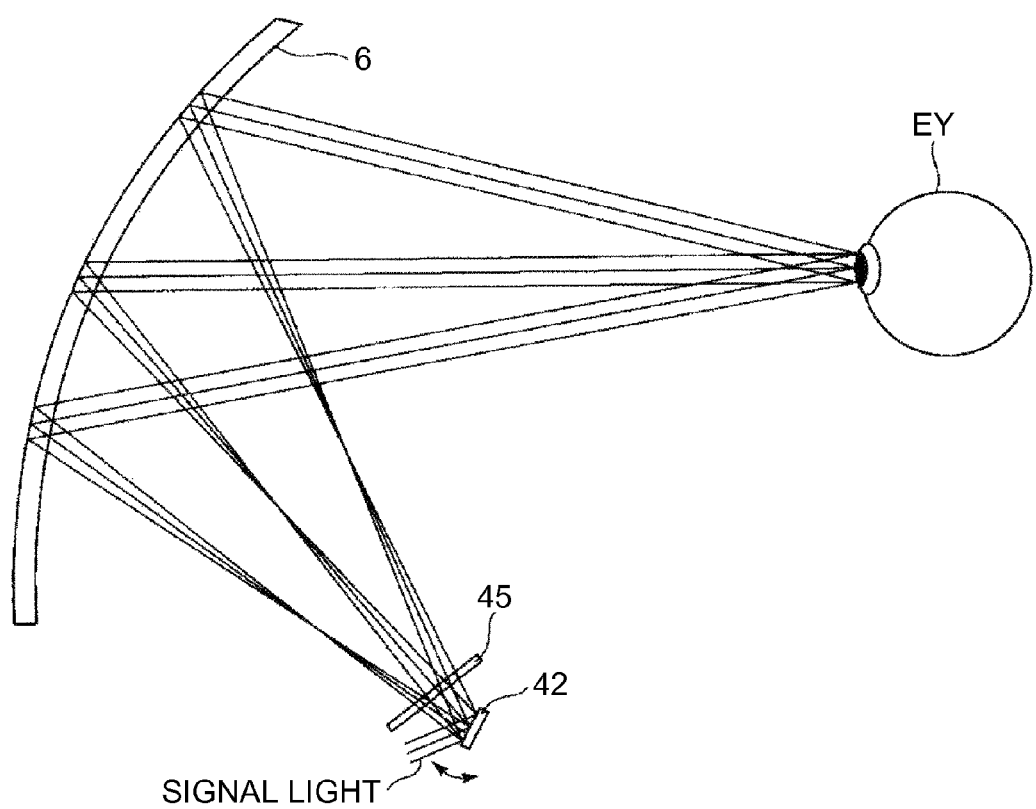
FIG. 5 is a view illustrating an operation of the light scanning portion illustrated in FIG. 4.

FIG. 1 is a view illustrating a schematic configuration of the embodiment (head-mounted display) of the image display apparatus according to the invention. FIG. 2 is a partially enlarged view of the image display apparatus illustrated in FIG. 1. In addition, FIG. 3 is a schematic configuration view of a signal generation portion of the image display apparatus illustrated in FIG. 1. FIG. 4 is a view illustrating a schematic configuration of a light scanning portion illustrated in FIG. 1. FIG. 5 is a view illustrating an operation of the light scanning portion illustrated in FIG. 4.

In addition, in FIG. 1, for convenience of description, an X axis, a Y axis, and a Z axis are illustrated as three axes which are perpendicular to each other. Tip end sides of arrows of the axes are "+ (positive)", and base end sides of the arrows of the axes are "− (negative)". In addition, a direction which is parallel to the X axis is an "X axis direction", a direction which is parallel to the Y axis is a "Y axis direction", and a direction which is parallel to the Z direction is a "Z axis direction".

Here, when an image display apparatus 1 which will be described later is mounted on a head H of an observer, the X axis, the Y axis, and the Z axis are set so that the Y axis direction is an up-and-down direction of the head H, the Z axis direction is a right-and-left direction of the head H, and the X axis direction is a front-and-rear direction of the head H.

As illustrated in FIG. 1, the image display apparatus 1 of the embodiment is the head-mounted display (head-mounted type image display apparatus) which has an external appearance like glasses, is used by being mounted on the head H of the observer, and allows the observer to visually confirm a state where an image by a virtual image is overlapped with an external image.

As illustrated in FIG. 1, the image display apparatus 1 is provided with a frame 2, a signal generation portion 3, a scanned light emitting portion 4, and a reflecting portion 6.

In addition, as illustrated in FIG. 2, the image display apparatus 1 is provided with a first optical fiber 7, a second optical fiber 8, and a connection portion 5.

In the image display apparatus 1, the signal generation portion 3 generates signal light which is modulated according to image information, the signal light is guided to the scanned light emitting portion 4 via the first optical fiber 7, the connection portion 5, and the second optical fiber 8, the scanned light emitting portion 4 emits scanned light by scanning the signal light two-dimensionally, and the reflecting portion 6 reflects the scanned light toward eyes EY of the observer. Accordingly, the observer can visually confirm the virtual image according to the image information.

In addition, in the embodiment, a case where the signal generation portion 3, the scanned light emitting portion 4, the connection portion 5, the reflecting portion 6, the first optical fiber 7, and the second optical fiber 8 are provided only on a right side of the frame 2, and only the virtual image for the right eye is formed, is described as an example. However, as a left side of the frame 2 is configured similarly to the right side, the virtual image for the right eye and the virtual image for the left eye may be formed together, and only the virtual image for the left eye may be formed.

Hereinafter, each part of the image display apparatus 1 will be described in order.

Frame

As illustrated in FIG. 1, the frame 2 is in a shape of a glasses frame, and has a function of supporting the signal generation portion 3 and the scanned light emitting portion 4.

In addition, as illustrated in FIG. 1, the frame 2 includes: a front portion 22 which supports the scanned light emitting portion 4 and a nose pad portion 21; a pair of temple portions (hooking portions) 23 which abuts against the ears of a user by being connected to the front portion 22; and a modern portion 24 which is an end portion of each temple portion 23 opposite to the front portion 22.

The nose pad portion 21 abuts against a nose NS of the observer when the apparatus is in use, and supports the image display apparatus 1 with respect to the head of the observer. The front portion 22 includes a rim portion 25 or a bridge portion 26.

The nose pad portion 21 is configured to be capable of adjusting a position of the frame 2 with respect to the observer when the apparatus is in use.

In addition, if the apparatus can be mounted on the head H of the observer, the shape of the frame 2 is not limited to that in the drawing.

Signal Generation Portion

As illustrated in FIG. 1, the signal generation portion 3 is provided in the modern portion 24 (end portion on a side opposite to the front portion 22 of the temple portion 23) of one side (right side in the embodiment) of the frame 2 described above.

In other words, the signal generation portion 3 is disposed on the side opposite to the eyes EY with respect to the ears EA of the observer when the apparatus is in use. Accordingly, a weight balance of the image display apparatus 1 can be excellent.

The signal generation portion 3 has a function of generating the signal light which is scanned by a light scanning portion 42 of the scanned light emitting portion 4 which will be described later, and a function of generating a driving signal which drives the light scanning portion 42.

As illustrated in FIG. 3, the signal generation portion 3 is provided with a signal light generation portion 31, a driving signal generation portion 32, a control portion 33, an optical detection portion 34, and a fixing portion 35.

The signal light generation portion 31 generates the signal light which is scanned (scanned light) by the light scanning portion 42 (optical scanner) of the scanned light emitting portion 4 which will be described later.

The signal light generation portion 31 has: a plurality of light sources 311R, 311G, and 311B (light source portions) which have different wavelengths from each other; a plurality of driving circuits 312R, 312G, and 312B; lenses 313R, 313G, and 313B; and a light combining portion (combining portion) 314.

The light source 311R (R light source) emits red light, the light source 311G (G light source) emits green light, and the light source 311B emits blue light. By using these three colors of light, it is possible to display a full-colored image.

The light sources 311R, 311G, and 311B are provided with a light emitting device (to be described later) according to the invention. In addition, the light emitting device will be described later.

The light sources 311R, 311G, and 311B are electrically connected to the driving circuits 312R, 312G, and 312B, respectively.

The driving circuit 312R has a function of driving the light source 311R described above, the driving circuit 312G has a function of driving the light source 311G described above, and the driving circuit 312B has a function of driving the light source 311B described above.

The three types (three colors) of light which are emitted from the light sources 311R, 311G, and 311B that are driven by the driving circuits 312R, 312G, and 312B, are incident on the light combining portion 314 via the lenses 313R, 313G, and 313B.

The lenses 313R, 313G, and 313B are respectively collimator lenses. Accordingly, the light emitted from the light sources 311R, 311G, and 311B are respectively formed to be parallel light, and are respectively incident on the light combining portion 314.

The light combining portion 314 combines the light from the plurality of light sources 311R, 311G, and 311B. Accordingly, the number of the optical fibers for transmitting the signal light generated by the signal light generation portion 31 to the scanned light emitting portion 4, can be small. For this reason, in the embodiment, it is possible to transmit the signal light from the signal generation portion 3 to the scanned light emitting portion 4 via one light transmission path which is formed of the first optical fiber 7, the connection portion 5 and the second optical fiber 8.

In the embodiment, the light combining portion 314 has three dichroic mirrors 314a, 314b, and 314c, and emits one ray of signal light by combining the rays of the light (three colors of light, such as the red light, the green light, and the blue light) emitted from the light sources 311R, 311G, and 311B. In addition, hereinafter, the light sources 311R, 311G, and 311B are all together referred to as a "light source portion 311". The signal light generated by the signal light generation portion 31 is referred to as "light emitted from the light source portion 311".

In addition, the configuration of the light combining portion 314 is not limited to the configuration in which the above-described dichroic mirrors are used, and for example, may be a configuration in which a prism, an optical waveguide, or an optical fiber is used.

The signal light generated by the signal light generation portion 31 is incident on one end portion of the first optical fiber 7. Then, the signal light passes through the first optical fiber 7, the connection portion 5, and the second optical fiber

8 in order, and is transmitted to the light scanning portion 42 of the scanned light emitting portion 4 which will be described later.

Here, in the vicinity of the end portion (hereinafter, simply referred to as "one end portion of the first optical fiber 7) of an incident side of the signal light of the first optical fiber 7, the optical detection portion 34 is provided. The optical detection portion 34 detects the signal light. In addition, one end portion of the first optical fiber 7 and the optical detection portion 34 are fixed to the fixing portion 35.

The driving signal generation portion 32 generates the driving signal which drives the light scanning portion 42 (optical scanner) of the scanned light emitting portion 4 which will be described later.

The driving signal generation portion 32 includes: a driving circuit 321 (first driving circuit) which generates a first driving signal that is used in scanning (horizontal scanning) in a first direction of the light scanning portion 42; and a driving circuit 322 (second driving circuit) which generates a second driving signal that is used in scanning (vertical scanning) in a second direction orthogonal to the first direction of the light scanning portion 42.

The driving signal generation portion 32 is electrically connected to the light scanning portion 42 of the scanned light emitting portion 4 which will be described later, via a signal line (not illustrated). Accordingly, the driving signal (the first driving signal and the second driving signal) generated by the driving signal generation portion 32 is input into the light scanning portion 42 of the scanned light emitting portion 4 which will be described later.

The above-described driving circuits 312R, 312G, and 312B of the signal light generation portion 31 and the driving circuits 321 and 322 of the driving signal generation portion 32, are electrically connected to the control portion 33.

The control portion 33 has a function of controlling the driving of the driving circuits 312R, 312G, and 312B of the signal light generation portion 31 and the driving circuits 321 and 322 of the driving signal generation portion 32, based on a video signal (image signal). In other words, the control portion 33 has a function of controlling the driving of the scanned light emitting portion 4. Accordingly, the signal light generation portion 31 generates the signal light which is modulated according to the image information, and the driving signal generation portion 32 generates the driving signal according to the image information.

In addition, the control portion 33 is configured to be capable of controlling the driving of the driving circuits 312R, 312G, and 312B of the signal light generation portion 31, based on an intensity of light detected by the optical detection portion 34.

Scanned Light Emitting Portion

As illustrated in FIGS. 1 and 2, the scanned light emitting portion 4 is installed in the vicinity (that is, the vicinity of the center of the front portion 22) of the bridge portion 26 of the above-described frame 2.

As illustrated in FIG. 4, the scanned light emitting portion 4 is provided with a housing 41 (case), a light scanning portion 42, a lens 43 (coupling lens), a lens 45 (condenser lens), and a supporting member 46.

The housing 41 is installed in the front portion 22 via the supporting member 46.

In addition, an outer surface of the housing 41 is bonded to a part on a side opposite to the frame 2 of the supporting member 46.

The housing 41 supports the light scanning portion 42 and accommodates the light scanning portion 42. In addition, the lens 43 and the lens 45 are installed in the housing 41, and the lens 43 and the lens 45 constitute a part (a part of a wall portion) of the housing 41.

In addition, the lens 43 (window portion through which the signal light of the housing 41 goes) is separated from the second optical fiber 8. In the embodiment, the end portion on the emitting side of the signal light of the second optical fiber 8 is positioned to face a reflecting portion 10 provided in the front portion 22 of the frame 2, and is separated from the scanned light emitting portion 4.

The reflecting portion 10 has a function of reflecting the signal light emitted from the second optical fiber 8 toward the light scanning portion 42. In addition, the reflecting portion 10 is provided in a concave portion 27 which is open to an inner side of the front portion 22. In addition, the opening of the concave portion 27 may be covered by the window portion which is configured by a transparent material. In addition, if the signal light can be reflected, the configuration of the reflecting portion 10 is not particularly limited. For example, the reflecting portion 10 can be configured by a mirror, a prism, or the like.

The light scanning portion 42 is the optical scanner which scans the signal light from the signal light generation portion 31 two-dimensionally. As the signal light is scanned by the light scanning portion 42, the scanned light is formed. Specifically, the signal light emitted from the second optical fiber 8 is incident on a light reflecting surface of the light scanning portion 42 via the lens 43. According to the driving signal generated by the driving signal generation portion 32, as the light scanning portion 42 is driven, the signal light is scanned two-dimensionally.

In addition, the light scanning portion 42 has a coil 17 and a signal superposition portion 18 (refer to FIG. 4), and the coil 17, the signal superposition portion 18, and the driving signal generation portion 32 constitute a driving portion which drives the light scanning portion 42.

The lens 43 has a function of adjusting a spot diameter of the signal light emitted from the first optical fiber 7. In addition, the lens 43 has a function of adjusting a radiation angle of the signal light emitted from the first optical fiber 7 and substantially parallelizes the angle.

The signal light (scanned light) scanned by the light scanning portion 42 is emitted to the outside of the housing 41 via the lens 45.

Reflecting Portion

As illustrated in FIGS. 1 and 2, the reflecting portion 6 is installed in the rim portion 25 which is included in the front portion 22 of the above-described frame 2.

In other words, the reflecting portion 6 is disposed to be positioned on a front side of the eyes EY of the observer when the apparatus is in use, and on a side far from the observer even further than the light scanning portion 42. Accordingly, a part which is projected to the front side of the face of the observer in the image display apparatus 1 can be prevented from being formed.

As illustrated in FIG. 5, the reflecting portion 6 has a function of reflecting the signal light from the light scanning portion 42 toward the eyes of the observer.

In the embodiment, the reflecting portion 6 is a half mirror, and even has a function (translucency with respect to visible light) of making external light go through. In other words, the reflecting portion 6 reflects the signal light from the light scanning portion 42, and has a function of making the external light go through toward the eyes of the observer from the outside of the reflecting portion 6 when the apparatus is in use. Accordingly, the observer can visually confirm the virtual image (image) which is formed by the signal light, while the observer visually confirms the external image. In other words, it is possible to realize a see-through type head-mounted display.

In addition, the reflecting portion 6 may have a diffraction grating, for example. In this case, by giving various optical properties to the diffraction grating, it is possible to reduce the number of components of an optical system, or to enhance flexibility of design. For example, as a hologram element is used as the diffraction grating, it is possible to adjust an emitting direction of the signal light which is reflected by the reflecting portion 6. In addition, by giving a lens effect to the diffraction grating, it is possible to adjust an imaging state of the entire scanned light which is formed from the signal light reflected by the reflecting portion 6.

In addition, the reflecting portion 6 may form a semi-transmissive reflecting film which is configured, for example, by a metal thin film or a dielectric multilayer film on a transparent substrate.

First Optical Fiber, Optical Detection Portion, and Fixing Portion

The fixing portion 35 has a function of fixing one end portion of the first optical fiber 7 to a position at which the intensity of the light incident on the first optical fiber 7 from the light source portion 311 is greater than zero and equal to or less than a predetermined value. Accordingly, it is possible to make the intensity of the light incident on the first optical fiber 7 from the light source portion 311 small.

In addition, the fixing portion 35 has a function of fixing the optical detection portion 34. Accordingly, it is possible to efficiently use remaining light which is not incident on the first optical fiber 7 among the rays of light (signal light) emitted from the light source portion 311, in the detection of the optical detection portion 34. In addition, it is possible to fix (constantly maintain) a positional relationship between one end portion of the first optical fiber 7 and the optical detection portion 34.

Even when the optical detection portion 34 fixed to the fixing portion 35 in this manner is not provided with the optical system which makes the signal light emitted from the light sources 311B, 311G, and 311R diverge, it is possible to detect the intensity of the emitted light by the optical detection portion 34. In addition, based on the intensity of the light detected by the optical detection portion 34, it is possible to adjust the intensity of the light emitted from the light sources 311B, 311G, and 311R by the control portion 33. In addition, the control portion 33 is configured by a "light control portion" which controls the light sources 311B, 311G, and 311R.

In addition, the embodiment of the image display apparatus according to the invention is not limited to an embodiment having a retina scanning type display principle, such as the above-described head-mounted display. In other words, the embodiment of the image display apparatus according to the invention may have a display principle other than the retina scanning type, such as a heads-up display, a laser projector, or a laser television. Even in a case of these display principles, there is a concern that reflected light is incident on the retina indirectly and coincidently. Therefore, by the invention, it is possible to expect similar operations and effects to a case of the retina scanning type.

Light Emitting Device

First Embodiment

Next, a first embodiment of the light emitting device according to the invention will be described.

Figure 6:
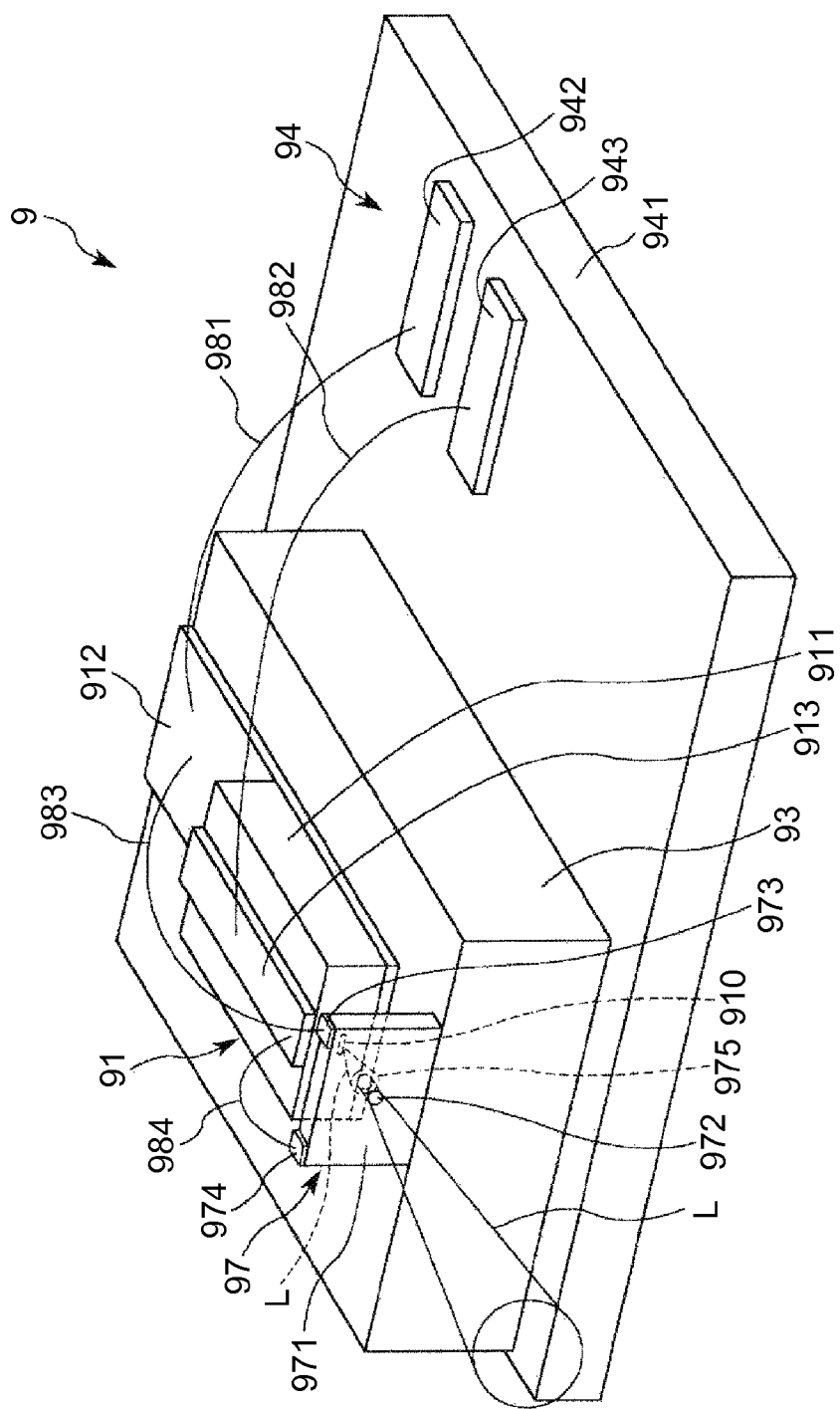
FIG. 6 is a perspective view illustrating a schematic configuration of a first embodiment (light source) of a light emitting device according to the invention.
Figure 7:
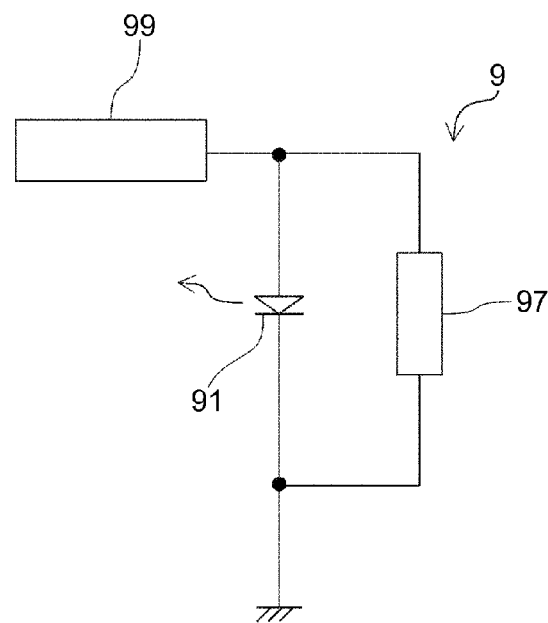
FIG. 7 is a circuit diagram illustrating an example of connection between the light emitting device illustrated in FIG. 6 and a current source.

FIG. 6 is a perspective view illustrating a schematic configuration of a first embodiment (light source) of the light emitting device according to the invention. FIG. 7 is a circuit diagram illustrating an example of connection between the light emitting device illustrated in FIG. 6 and a current source. In addition, in the description below, an upside of FIG. 6 will be described as "up", and a downside of FIG. 6 will be described as "down".

The above-described light sources 311R, 311G, and 311B are respectively configured by the embodiments of the light emitting device according to the invention.

The light emitting device 9 illustrated in FIG. 6 is provided with a light emitting element 91, a light variable resistive element 97, a mount 93, and a mounting substrate 94.

In addition, as illustrated in FIG. 7, the light emitting element 91 and the light variable resistive element 97 are connected to each other in parallel. In addition, an anode of the light emitting element 91 is connected to a current source 99, and is electrically grounded to a cathode side. In addition, the current source 99 corresponds to each current source which is provided in the above-described plurality of driving circuits 312R, 312G, and 312B.

Mounting Substrate

The mounting substrate 94 is a substrate for mounting the mount 93 on which the light emitting element 91 and the light variable resistive element 97 are loaded.

The mounting substrate 94 is provided with an insulating substrate 941 and two external electrode terminals 942 and 943 provided on the surface thereof. In addition, although not illustrated in the drawing, there is provided a wiring which is connected to the external electrode terminals 942 and 943. The light emitting element 91 and the current source 99 are connected to each other via the external electrode terminals 942 and 943.

In addition, the mounting substrate 94 can be provided as necessary, and can be omitted.

Mount

The mount 93 is used as a foundation on which the light emitting element 91 is mounted. In general, the mount is configured by a material having a high thermal conductivity, and has a function of dissipating the heat generated by the light emitting element 91 at high efficiency. In addition, the mount 93 also has high insulation properties, and has a function of ensuring the insulation with the light emitting element 91 and a heat sink (not illustrated) or the like. Accordingly, it is possible to stabilize the light emitting of the light emitting element 91.

As a configuration material of the mount 93, for example, a ceramics material, such as aluminum nitride or silicon carbide, and a metal material, such as copper or aluminum, can be used. In addition, as necessary, the mount 93 is configured by a composite in which a metal layer is formed on one surface or on both surfaces of the substrate made of the ceramics material.

In addition, the heat sink (not illustrated) may be provided between the mount 93 and the mounting substrate 94.

In addition, the mount 93 can be provided as necessary, and can be omitted in a case where the amount of heat from the light emitting element 91 is small, or the like.

Light Emitting Element

Examples of the light emitting element 91 include a semiconductor laser (LD), a super luminescent diode (SLD), a light emitting diode (LED), an organic EL element, an inorganic EL element, or the like. However, an edge emitting type semiconductor laser is illustrated as an example in FIG. 6.

In general, a structure of the semiconductor laser is a chip structure in which an electrode or the like is installed on a laminated body which is made by laminating layers configured by a semiconductor material, and has a shape of a rectangular parallelepiped or a shape which is equivalent thereto. The edge emitting type semiconductor laser has a configuration in which a resonator for resonating the light is parallel to a semiconductor substrate surface. The reflecting surfaces of the resonator are two cleavage planes of the semiconductor substrate. As the light is extracted from one cleavage plane, the laser is emitted.

The light emitting element 91 illustrated in FIG. 6 has: a semiconductor portion 911 which is configured by the laminated body including an n-type semiconductor layer, an active layer, and a p-type semiconductor layer; a lower electrode 912 which is provided on a lower side of the semiconductor portion 911; and an upper electrode 913 which is provided on an upper side of the semiconductor portion 911. The lower electrode 912 and the upper electrode 913 are respectively configured by conductor layers.

The light emitting element 91 is loaded on the mount 93. Accordingly, the lower electrode 912 is interposed between the semiconductor portion 911 and the mount 93. In addition, the lower electrode 912 extends along a longitudinal direction of the light emitting element 91 and along an upper surface of the mount 93, to be protruded from the semiconductor portion 911. Meanwhile, a width of the upper electrode 913 is narrower than a width of the semiconductor portion 911.

In addition, the lower electrode 912 and the external electrode terminal 942 are electrically connected to each other via a bonding wire 981. Meanwhile, the upper electrode 913 and the external electrode terminal 943 are electrically connected to each other via a bonding wire 982. Among the external electrode terminal 942 and the external electrode terminal 943, if the current flows to the anode side of the light emitting element 91, the light is emitted from an emitting portion 910 of the light emitting element 91. In a case of the semiconductor laser, as a composition of the semiconductor material which constitutes the semiconductor portion 911 is changed, it is possible to select a wavelength (color) of the emitted light.

In addition, in the description above, the lower electrode 912, the upper electrode 913, and the semiconductor portion 911 are all together considered as the light emitting element 91. However, examples of the light emitting element 91 is not limited thereto, and for example, a conductive material, such as an AuSn eutectic solder, may be interposed between the lower electrode 912 and the semiconductor portion 911.

In addition, when the mount 93 is made of a metal material or when the mount 93 is made of a ceramics material provided with a metal layer on a surface thereof, since the metal portions function as an electrode, it is possible to omit the lower electrode 912.

Light Variable Resistive Element

The light variable resistive element 97 according to the embodiment is a resistive element having a characteristic in which a resistance value decreases as the amount of irradiation light increases. Examples of the resistive element having such a characteristic include a photoresistor, an intrinsic semiconductor element, an impurity semiconductor element, or the like. Among these examples, by using the photoresistor, it is possible to change the resistance value since an amount of electric charge changes according to the amount of light by an internal photoelectric effect of a compound semiconductor. For example, when the amount of light which irradiates the photoresistor increases, the amount of electric charge increases, and thus, the resistance value decreases. Examples of the compound semiconductor which is used in the photoresistor include cadmium sulfide (Cds), lead sulfide (PdS), lead selenide (PbSe), or the like. However, in the viewpoint of a responsiveness in the visible light, it is preferable to use the cadmium sulfide.

In the embodiment, light L is emitted from the emitting portion 910 of the light emitting element 91, but the light variable resistive element 97 is provided at a position facing the emitting portion 910. For this reason, when the light L is emitted from the emitting portion 910, the light variable resistive element 97 is irradiated with the light L.

Meanwhile, the light variable resistive element 97 according to the embodiment is in a flat board shape as illustrated in FIG. 6, and the shape in a planar view thereof is a substantial square. In addition, the shape thereof is not particularly limited.

In addition, the light variable resistive element 97 has: a light detection portion 971 in which the irradiation light is applied to the resistance value; an opening portion 972 through which the light variable resistive element 97 passes in a thickness direction; and a pair of terminal electrodes 973 and 974 provided in the light detection portion 971. The light variable resistive element 97 is disposed at a position where the light L emitted from the light emitting element 91 can pass through the opening portion 972. In other words, the light L is emitted to the outside of the light emitting device 9 via the opening portion 972.

Here, the light L emitted from the light emitting element 91 is usually transferred as a ray of light having a predetermined flare angle. For this reason, when the light variable resistive element 97 is irradiated with the light L, an irradiation area 975 illustrated in FIG. 6 is generated. At this time, if the opening portion 972 is disposed on an inner side of the range of the irradiation area 975, at least a part of the light L can pass through the opening portion 972.

In the embodiment, the position of the light variable resistive element 97 and the size of the opening portion 972 are set so that the opening portion 972 is disposed on the inner side of the irradiation area 975 and an area of the irradiation area 975 is greater than an area of the opening portion 972. By setting in this manner, while a part of the light L passes through the opening portion 972, the light detection portion 971 is irradiated with another part of the light L. As a result, in the light emitting device 9, it is possible to perform both the emission of the light L and the detection of the amount of light L at the same time. Since it is not necessary to ensure an extra space for light variable resistive element 97, the size of the apparatus can be reduced.

When the light detection portion 971 is irradiated with the light, the resistance value of the light detection portion 971 decreases according to the amount of irradiation light by the internal photoelectric effect.

As described above, the light emitting element 91 and the light variable resistive element 97 are connected to each other in parallel. For this reason, the current, which flows through a line on the light emitting element 91 side before the increase in the amount of light, flows through a line on the light variable resistive element 97 side as the resistance value of the light variable resistive element 97 decreases after the increase in the amount of light. As a result, the current which flows through the line on the light emitting element 91 side decreases.

In the semiconductor laser or the like, since the driving current and the amount of light is in a substantially proportional relationship, when the current which flows through the line on the light emitting element 91 side decreases, the amount of light of the light emitting element 91 decreases. Accordingly, the amount of light of the light emitting element 91 is prevented from being increased any more.

In addition, as described above, the light L is transferred as a ray of light having a predetermined flare angle. For this reason, at a time of adjusting a size relationship between the area of the opening portion 972 and the area of the irradiation area 975, the distance between the light emitting element 91 and the light variable resistive element 97 may be changed.

The above-described behavior is based on basic characteristics of the light variable resistive element 97 which is one of passive elements, and differs from a behavior based on an operation of an active element which is called an IC including an electronic circuit. In addition, the light variable resistive element 97 can be considered as an element having a high tolerance with respect to an environment change, such as a temperature change or a shock, compared to the IC or the like, and having an extremely low failure probability. For this reason, according to the embodiment, it is possible to suppress the amount of the light emitted from the light emitting element 91 to be equal to or lower than a certain value without following a calculation or the like. Therefore, it is possible to sufficiently secure safety of the light emitting device 9. In other words, in the image display apparatus 1 which causes the signal light to be directly incident toward the eyes EY of the observer, even if the current which flows in the light emitting element 91 is extremely high, since the current can be quickly suppressed and the amount of light can be suppressed to be equal to or less than the certain amount, it is possible to suppress an adverse effect on the retina of the observer to a minimum.

Figure 8:
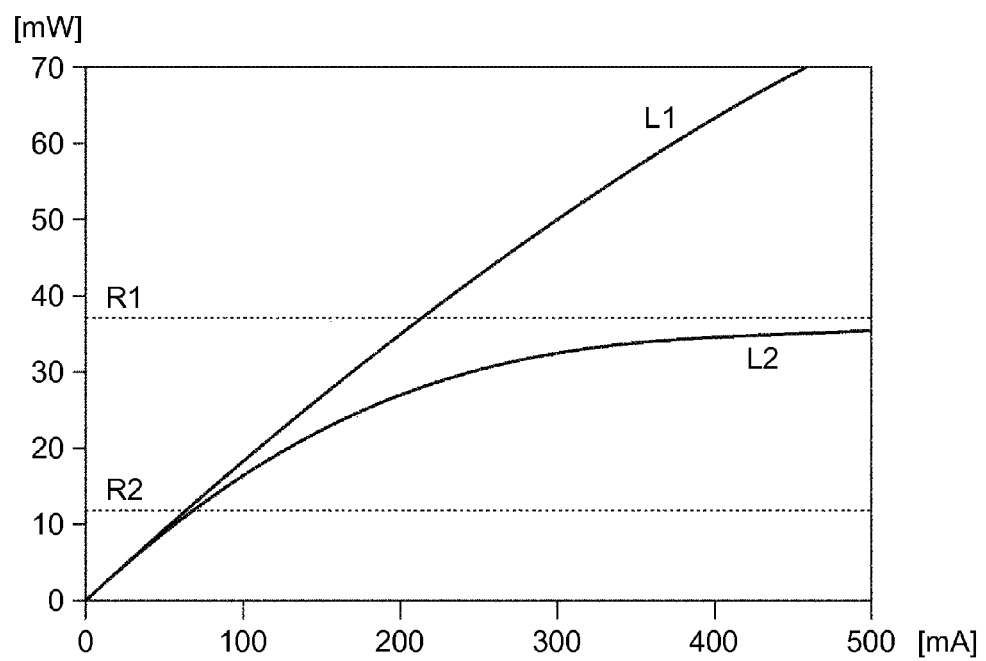
FIG. 8 is a schematic view illustrating a difference of a relationship between a driving current and an amount of light of the light emitting element, according to a presence or an absence of a light variable resistive element.

FIG. 8 is a schematic view illustrating a difference of a relationship between the driving current and the amount of light of the light emitting element, according to a presence or an absence of the light variable resistive element. In addition, a dotted line R1 illustrated in FIG. 8 is a line illustrating an example of an upper limit of the amount of light which does not have an adverse effect on the retina. In addition, a dotted line R2 illustrated in FIG. 8 is a line illustrating an example of the upper limit of the amount of light which is used at a normal time in the image display apparatus 1.

When the light variable resistive element 97 is not provided, as the current which flows in the light emitting element 91 increases, the amount of the light emitted from the light emitting element 91 increases substantially being proportional to the current, as illustrated as a solid line L1. For this reason, when the solid line L1 exceeds the dotted line R1, there is a concern about an adverse effect on the retina.

Meanwhile, even when the light variable resistive element 97 is provided, as illustrated as a solid line L2 in FIG. 8, at first, as the current which flows in the light emitting element 91 increases, the amount of light increases. However, since the current which flows in the light emitting element 91 decreases as the amount of light increases, a ratio of increase in the amount of light gradually deteriorates. Finally, the amount of light reaches a state where the amount of light converges on a certain value, or a state (saturated state) where the amount of light is stuck in an extremely slight increase. At this time, it is possible to adjust the saturation level of the amount of light by appropriately selecting an element having a different relationship between the change in the amount of light irradiating the light detection portion 971 and the resistance value change. Therefore, if the solid line L2 is set not to exceed the dotted line R1, it is possible to realize the light emitting device 9 which sufficiently secures safety.

In addition, there is a surface mounting type photoresistor or a reed type photoresistor. However, any type of photoresistor may be used.

In addition, in the embodiment, a part of the light L passes through the opening portion 972, and the light detection portion 971 is irradiated with another part of the light. However, it is preferable that a part of the light L which passes through the opening portion 972 be light which corresponds to a central part of a cross section in the light L. In the central part of the cross section of the light L, a distribution width of the wavelength is relatively narrow, and many rays of light which are close to ideal monochromatic light are included. For this reason, if the light in the central part is configured to selectively pass through the opening portion 972, for example, when the light emitting device 9 is used as a light source of the image display apparatus 1, it is possible to enhance color reproducibility of an image.

Meanwhile, in a peripheral part of the cross section of the light L, there is a case where the distribution width of the wavelength is relatively wide and relatively many rays of light of a wavelength other than a peak wavelength is included. For this reason, if the light detection portion 971 is irradiated with the peripheral part of the light, for example, it is possible to enhance color reproducibility of the image display apparatus 1, and to sufficiently secure safety of the image display apparatus 1.

In addition, in the light variable resistive element 97, a speed of applying the change of the amount of irradiation light to the change of the resistance value, that is, a response speed is relatively high compared to other variable resistive elements. For this reason, when the amount of light L exceeds the certain value, the resistance value of the light variable resistive element 97 quickly decreases, and accordingly, the amount of light of the light emitting element 91 quickly decreases. For this reason, after the amount of light of the light emitting element 91 exceeds the certain value, a time lag until the resistance value of the light variable resistive element 97 is sufficiently small and the current decreases to an extent that the amount of light of the light emitting element 91 is lower than the certain value, is reduced. This also causes the time for emitting the light having an amount that adversely affects the retina to be a minimum. Accordingly, it is possible to further enhance safety of the light emitting device 9.

In addition, the terminal electrode 973 and the lower electrode 912 of the light emitting element 91 are electrically connected to each other via a bonding wire 983. Meanwhile, the terminal electrode 974 and the upper electrode 913 of the light emitting element 91 are electrically connected to each other via a bonding wire 984. As the light variable resistive element 97 and the light emitting element 91 are connected to each other in parallel in this manner, as described above, without largely changing voltage applied to the light emitting element 91, it is possible to reduce the current which flows in the light emitting element 91. For this reason, it is possible to achieve both a stable light emitting and a safety securing of the light emitting element 91.

In addition, in the light emitting device 9 illustrated in FIG. 6, both the light emitting element 91 and the light variable resistive element 97 are mounted on the mount 93. For this reason, the heat generated from the light emitting element 91 can be conducted to the mount 93, and it is possible to efficiently dissipate the heat from the light emitting element 91. Furthermore, a generation of a failure, such as a significant increase in the temperature of the light variable resistive element 97 and an unintentional change in the resistance value, can be suppressed.

In addition, the position of the light variable resistive element 97 is not limited to the above-described position, and for example, the light variable resistive element 97 may be mounted on the mounting substrate 94.

Second Embodiment

Next, a second embodiment of the light emitting device according to the invention will be described.

Figure 9:
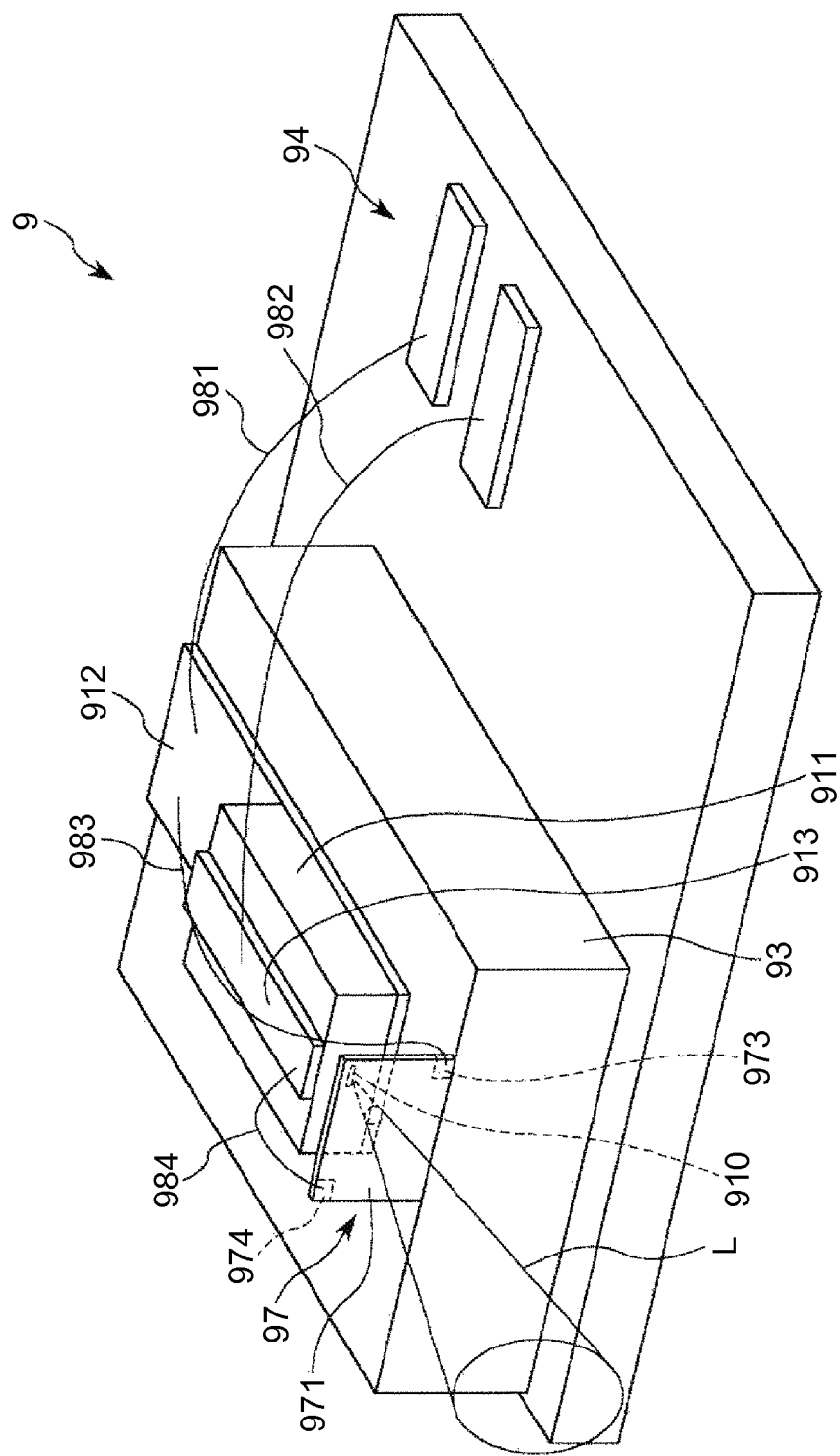
FIG. 9 is a perspective view illustrating a second embodiment of the light emitting device according to the invention.

FIG. 9 is a perspective view illustrating the second embodiment of the light emitting device according to the invention.

Hereinafter, the second embodiment will be described, but in the description below, differences from the above-described first embodiment will be mainly described, and similar parts and the description thereof will be omitted. In addition, in the drawing, the same configuration as that of the above-described embodiment is given the same reference numerals.

The second embodiment is similar to the first embodiment except that the structure of the light variable resistive element 97 is different.

In the light variable resistive element 97 according to the second embodiment, the light detection portion 971 has optical transparency, and the opening portion 972 illustrated in FIG. 9 is omitted. When the light variable resistive element 97 is irradiated with the light L, the light L goes through the light detection portion 971. At this time, the light L causes a change in the resistance value by the internal photoelectric effect in the light detection portion 971. Meanwhile, the light L which does not contribute to the internal photoelectric effect goes through the light detection portion 971 and is emitted from the light emitting device 9.

By this configuration, while suppressing the decrease in the amount of light of the light L, it is possible to change the resistance value of the light variable resistive element 97. For this reason, while securing safety of the light emitting device 9, it is possible to realize the light emitting device 9 having a large amount of light.

In addition, example of the light variable resistive element 97 having optical transparency includes a light variable resistive element in which an electrode portion of the photoresistor is replaced with a transparent electrode. In a common photoresistor, two electrodes are disposed via a compound semiconductor, and a metal material having an excellent conductivity, such as aluminum or the like, is used as a configuration material of the electrode. The electrode portion is configured by a transparent conductive material, such as indium tin oxide (ITO), fluorine-doped tin oxide (FTO), or tin oxide (TO). Accordingly, optical transparency is given to a part other than the compound semiconductor.

Therefore, as the alignment of the light variable resistive element 97 is determined so that the compound semiconductor is irradiated with a part of the cross section of the light L, most of the light L can go through the light variable resistive element 97.

Even in the second embodiment, similar operations and effects to those of the first embodiment can be obtained.

Third Embodiment

Next, a third embodiment of the light emitting device according to the invention will be described.

Figure 10:
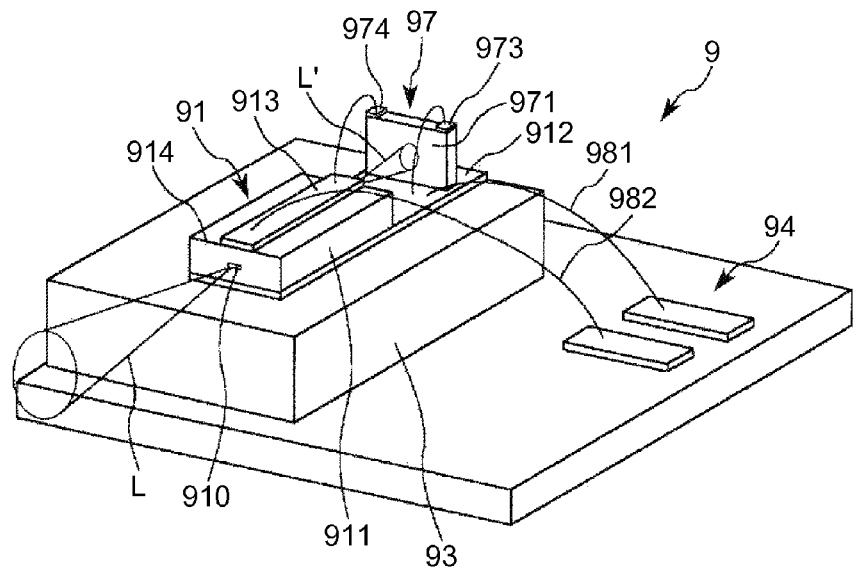
FIG. 10 is a perspective view illustrating a third embodiment of the light emitting device according to the invention.

FIG. 10 is a perspective view illustrating the third embodiment of the light emitting device according to the invention.

Hereinafter, the third embodiment will be described, but in the description below, differences from the above-described first and second embodiments will be mainly described, and similar parts and the description thereof will be omitted. In addition, in the drawing, the same configuration as that of the above-described embodiment is given the same reference numerals.

The third embodiment is also similar to the first embodiment except that the alignment of the light variable resistive element 97 is different.

The shape in a planar view of the light emitting element 91 illustrated in FIG. 10 is a rectangle (oblong), and the emitting portion 910 which emits the light L is provided in a first side surface corresponding to a first side 914 of the rectangle. In addition, the first side surface which is provided with the emitting portion 910 is usually called a front end surface.

When the light emitting element 91 is the end surface light emitting type semiconductor laser, there is not only an element of a type in which the light is emitted from the front end surface (first side surface) but also an element of a type in which light L' is emitted from a second side surface which is positioned on a side opposite to the first side surface. The second side surface is usually called a rear end surface. In the light emitting device 9 illustrated in FIG. 10, the light variable resistive element 97 is disposed to correspond not to the front end surface of the light emitting element 91, but to the rear end surface of the light emitting element 91.

An amount of the light L' emitted from the rear end surface has a certain correlation with the amount of the light L emitted from the front end surface. For this reason, as the light variable resistive element 97 is irradiated with the light L' emitted from the rear end surface, it is possible to adjust the current which flows in the light emitting element 91 so that the light L emitted from the front end surface does not exceed regulatory limits.

In other words, since the light L emitted from the front end surface does not influence the light variable resistive element 97 at all, the emitted light becomes light having characteristics which are originally included in the light emitting element 91. For this reason, for example, a problem, such as an insufficient amount of light, is unlikely to be generated, and the light emitting device 9 contributes to realizing the image display apparatus 1 which is capable of displaying an excellent image.

In addition, in the embodiment, the opening portion 972 of the light variable resistive element 97 is not necessary.

Even in the third embodiment, similar operations and effects to those of the first embodiment can be obtained.

Fourth Embodiment

Next, a fourth embodiment of the light emitting device according to the invention will be described.

Figure 11:
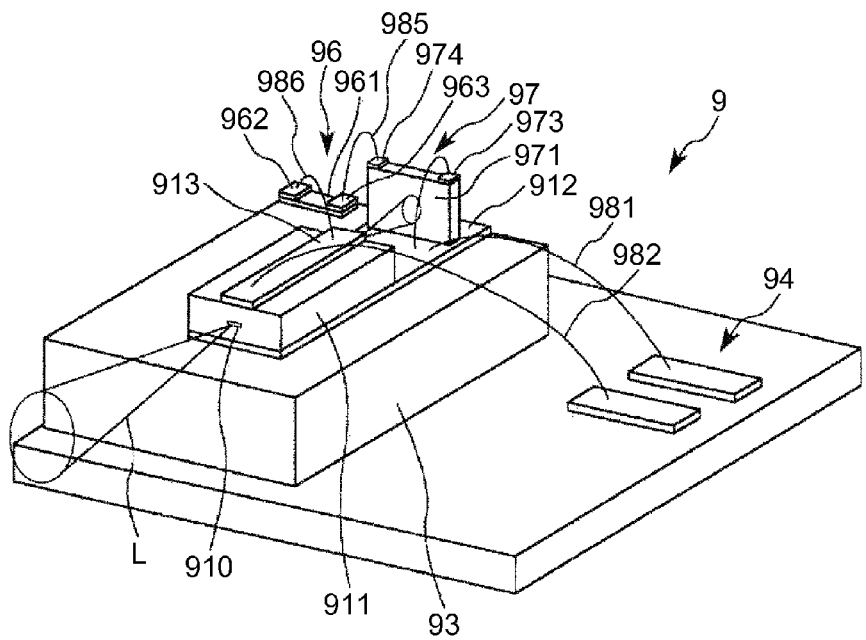
FIG. 11 is a perspective view illustrating a fourth embodiment of the light emitting device according to the invention.

FIG. 11 is a perspective view illustrating the fourth embodiment of the light emitting device according to the invention.

Hereinafter, the fourth embodiment will be described, but in the description below, differences from the above-described first to third embodiments will be mainly described, and similar parts and the description thereof will be omitted. In addition, in the drawing, the same configuration as that of the above-described embodiment is given the same reference numerals.

The fourth embodiment is similar to the third embodiment except that the resistive element 96 which is connected to the light variable resistive element 97 in series is provided.

As illustrated in FIG. 11, the light emitting device 9 according to the fourth embodiment is provided with the resistive element 96 which is mounted on the mount 93.

The resistive element 96 illustrated in FIG. 11 has: a resistance portion 961; a terminal electrode 962 which is provided at one end thereof; and a terminal electrode 963 which is provided at the other end thereof. The terminal electrode 974 of the light variable resistive element 97 and the terminal electrode 963 of the resistive element 96 are electrically connected to each other via a bonding wire 985. Meanwhile, the upper electrode 913 of the light emitting element 91 and the terminal electrode 962 of the resistive element 96 are electrically connected to each other via a bonding wire 986.

As the resistive element 96 is connected to the light variable resistive element 97 in series, the resistive element 96 functions as the detection portion which detects the amount of the current which flows in the light variable resistive element 97. In other words, when the current flows through the line on the light variable resistive element 97 side, a potential difference is generated according to the resistance value between the terminal electrodes of the resistive element 96. For this reason, as the potential difference is measured, it is possible to estimate the amount of the current which flows in the light variable resistive element 97.

As the size of the current is detected in this manner, the size of the current which flows through the line on the light emitting element 91 side can be estimated. For this reason, it is possible to indirectly assume the amount of light of the light emitting element 91. Accordingly, it is possible to easily find the amount of light of the light emitting element 91. In addition, in the image display apparatus 1, since data for comparing a current value assigned to the light source by the control portion 33 and a current value which flows in the light emitting element 91 can be acquired, it is possible to perform the detection which is called confirming an integrity of the light emitting element 91, for example.

In addition, there is a case where the resistive element 96 is called a shunt. The resistance value varies according to the voltage or the current applied to the circuit, but is set to be equal to or less than 10Ω, for example.

Even in the fourth embodiment, similar operations and effects to those of the first embodiment can be obtained.

Fifth Embodiment

Next, a fifth embodiment of the light emitting device according to the invention will be described.

Figure 12:
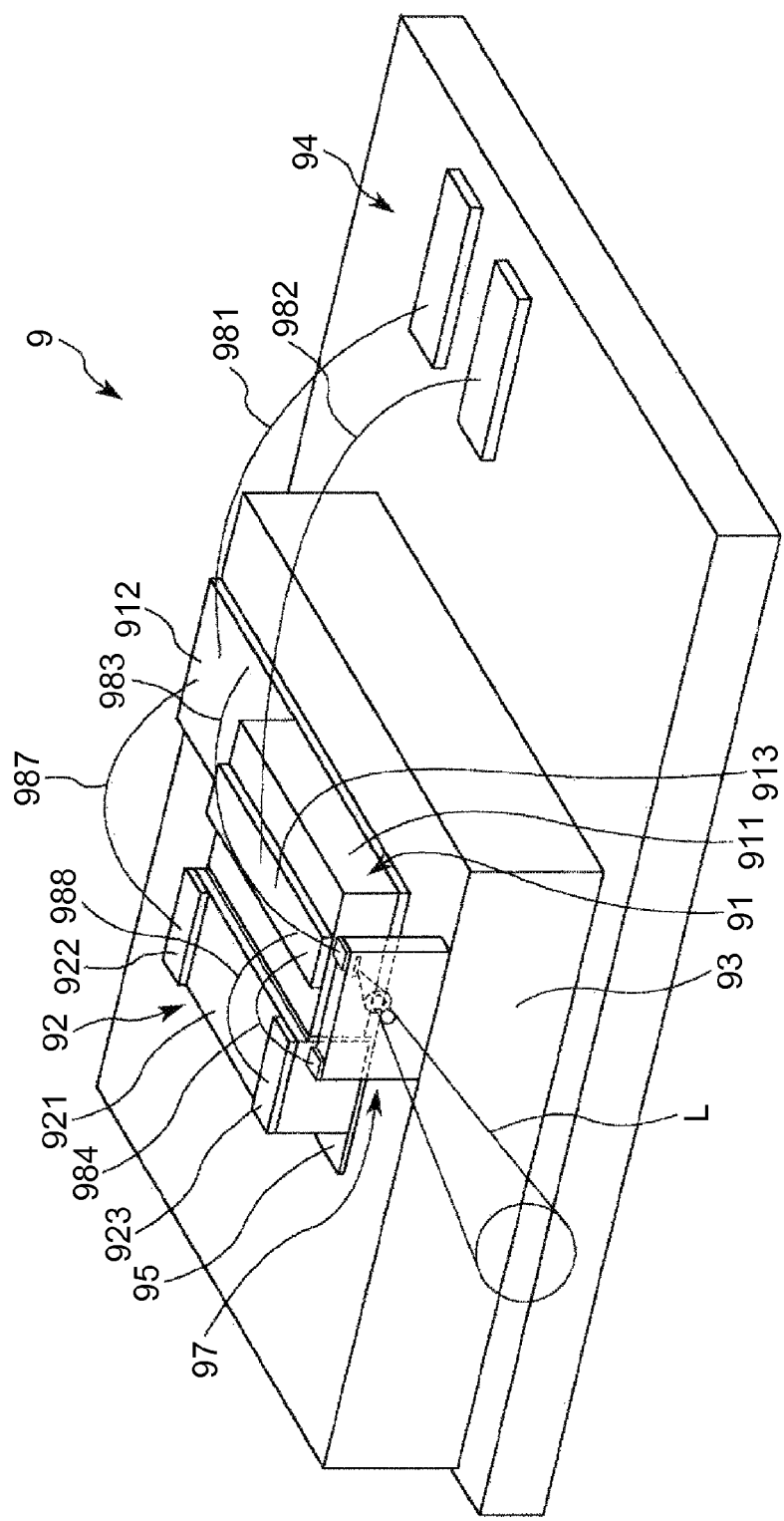
FIG. 12 is a perspective view illustrating a fifth embodiment of the light emitting device according to the invention.

FIG. 12 is a perspective view illustrating the fifth embodiment of the light emitting device according to the invention.

Hereinafter, the fifth embodiment will be described, but in the description below, differences from the above-described first to fourth embodiments will be mainly described, and similar parts and the description thereof will be omitted. In addition, in the drawing, the same configuration as that of the above-described embodiment is given the same reference numerals.

The fifth embodiment is similar to the first embodiment except that the temperature variable resistive element 92 which is connected to the light variable resistive element 97 in parallel is further provided.

As illustrated in FIG. 12, the light emitting device 9 according to the fifth embodiment is provided with the temperature variable resistive element 92 which is mounted on the mount 93. The temperature variable resistive element 92 is a resistive element having a characteristic in which the resistance value decreases as the temperature increases. Examples of the resistive element having such a characteristic include an NTC thermistor, a CTR thermistor, or the like. Among these, it is preferable to use the NTC thermistor which is easily made small and has high responsiveness.

In the embodiment, the light emitting element 91 and the temperature variable resistive element 92 are disposed to be close to each other so that the heat conduction between the light emitting element 91 and the temperature variable resistive element 92 can be performed easily. For this reason, when the heat is generated as the light emitting element 91 is driven, the heat is conducted to the temperature variable resistive element 92, and the temperature of the temperature variable resistive element 92 increases. When the temperature of the temperature variable resistive element 92 increases, the resistance value of the element decreases based on the above-described characteristics.

As described above, the light variable resistive element 97 and the temperature variable resistive element 92 are connected to each other in parallel. Therefore, the temperature variable resistive element 92 is connected even to the light emitting element 91 in parallel. For this reason, the current, which flows through a line on the light emitting element 91 side before the increase in the temperature, flows through a line on the temperature variable resistive element 92 side as the resistance value of the temperature variable resistive element 92 decreases after the increase in the temperature. As a result, the current which flows through the line on the light emitting element 91 side decreases.

The above-described behavior is based on basic characteristics of the temperature variable resistive element 92 which is one of passive elements. Therefore, the temperature variable resistive element 92 can be considered as an element having a high tolerance with respect to an environment change, such as a temperature change or a shock, compared to the IC or the like, and having an extremely low failure probability.

For this reason, the temperature variable resistive element 92, together with the light variable resistive element 97, can suppress the amount of light emitted from the light emitting element 91 to be equal to or less than a certain value, and can more reliably secure safety of the light emitting device 9. In other words, in the image display apparatus 1 which causes the signal light to be directly incident toward the eyes EY of the observer, even if the current which flows in the light emitting element 91 is extremely high, since the current can be quickly suppressed and the amount of light can be suppressed to be equal to or less than the certain amount, it is possible to suppress an adverse effect on the retina of the observer to a minimum.

In addition, there is a chip type or a reed type of the NTC thermistor. In particular, it is preferable to use the chip type NTC thermistor. The chip type NTC thermistor can be easily disposed to be close to the chip type light emitting element 91 illustrated in FIG. 12, and the distance therebetween is easily shortened. For this reason, an area which contributes to the heat conduction between the light emitting element 91 and the temperature variable resistive element 92 becomes large. As a result, the thermal conductivity between the light emitting element 91 and the temperature variable resistive element 92 increases. Therefore, it is possible to reduce a time difference between the light emitting element 91 and the temperature variable resistive element 92 as the temperature increases. Accordingly, after the amount of light of the light emitting element 91 exceeds the certain value, a time lag until the resistance value of the temperature variable resistive element 92 is sufficiently small and the current decreases to an extent that the amount of light of the light emitting element 91 is lower than the certain value, is reduced. This also causes the time for emitting the light having an amount that adversely affects the retina to be a minimum. Accordingly, it is possible to further enhance safety of the light emitting device 9.

In addition, in the light emitting device 9 illustrated in FIG. 12, the light emitting element 91 and the temperature variable resistive element 92 are insulated via a layer-shaped insulator 95. For this reason, even when the light emitting element 91 and the temperature variable resistive element 92 are disposed close to each other, while preventing the generation of a failure, such as a short circuit, it is possible to enhance the thermal conductivity between the light emitting element 91 and the temperature variable resistive element 92.

In addition, from such a viewpoint, as an insulator 95, it is preferable to use a member which has a thermal conductivity. Examples of the insulator 95 having a thermal conductivity include ceramics, a thermally conductive grease, a thermally conductive adhesive, a thermally conductive tape, or the like. Among these, in the viewpoint of insulation properties and adhesiveness, it is preferable to configure the insulator by an epoxy resin or a polyimide resin. Even in a case of the resin material, by making the thickness of the insulator 95 thin, it is possible to sufficiently ensure the thermal conductivity. In addition, in order to enhance the thermal conductivity, there is even a case where a certain amount of conductive particles is added as necessary.

The temperature variable resistive element 92 illustrated in FIG. 12 is an example of the chip type NTC thermistor, and is provided with a thermistor prime field 921 and a pair of terminal electrodes 922 and 923 which is provided on an upper surface thereof. The thermistor prime field 921 is configured by the semiconductor material which has an oxide of a transition metal, such as manganese, nickel, or cobalt, as a main component. As the temperature of the thermistor prime field 921 changes, the resistance value between the terminal electrode 922 and the terminal electrode 923 changes. In addition, as an internal electrode is provided in the thermistor prime field 921 as necessary, the thermistor prime field 921 may have a lamination structure.

In addition, the terminal electrode 922 and the lower electrode 912 of the light emitting element 91 are electrically connected to each other via a bonding wire 987. Meanwhile, the terminal electrode 923 and the upper electrode 913 of the light emitting element 91 are electrically connected to each other via a bonding wire 988.

In addition, in the light emitting device 9 illustrated in FIG. 12, both the light emitting element 91 and the temperature variable resistive element 92 are mounted on the mount 93. For this reason, while the heat from the light emitting element 91 can be conducted to the temperature variable resistive element 92, the heat can be conducted to the mount 93. Since the mount 93 generally has a relatively high heat capacity, it is possible to contribute to dissipating the heat of the light emitting element 91.

Meanwhile, the layer-shaped insulator 95 is interposed between the temperature variable resistive element 92 and the mount 93. Accordingly, even when the mount 93 has a conductivity, it is possible to prevent a short circuit between the temperature variable resistive element 92 and the mount 93. In addition, as the insulator 95 has a heat conductivity, heat dissipation properties of the temperature variable resistive element 92 are improved. As a result, it is possible to avoid a failure in which the heat conducted from the light emitting element 91 to the temperature variable resistive element 92 remains in the temperature variable resistive element 92, and the temperature change of the temperature variable resistive element 92 does not sufficiently conform with the temperature change of the light emitting element 91.

In addition, in the light emitting device 9 according to the embodiment, both the above-described light variable resistive element 97 and the temperature variable resistive element 92 are used. It is possible to secure safety based on two different principles which are a principle in which the light is used and a principle in which the heat is used, and to particularly enhance security of the light emitting device 9. In addition, for example, it is possible to detect a failure of the light emitting element 91 in which the amount of light does not increase, but a heating amount increases. In other words, as the light variable resistive element 97 and the temperature variable resistive element 92 are respectively connected to the resistive element 96 (refer to FIG. 11) in series, it is possible to easily detect the current which flows through each line. For this reason, when an increase amount of light and an increase amount of heating are compared, and the increase amount of heating is extremely large, it is possible to confirm that there is a failure in the light emitting element 91.

In addition, in the light emitting device 9 illustrated in FIG. 12, as the temperature increases, a time difference which is difficult to be compensated is generated between the light emitting element 91 and the temperature variable resistive element 92. During this short period of time, the amount of light of the light emitting element 91 remains to be above the certain value. Meanwhile, if the time period is short like this, even when the amount of light is above regulatory limits, it is considered that an adverse effect on the retina is small.

Here, during the short time period until the current which flows in the light emitting element 91 is defined, the light having a large amount is emitted from the light emitting element 91. Therefore, in the light emitting device 9, the light having a large amount may be used as light which is emitted to send a command of warning. As such a warning (alarm) is generated, the user of the light emitting device 9, that is, the user of the image display apparatus 1 can know of an abnormality of the light emitting device 9. For example, it is possible to obtain a chance to take an action, such as restraining the use of the apparatus for a certain period of time, or inspecting and repairing the light emitting device 9.

Even in the fifth embodiment, similar operations and effects to those of the first embodiment can be obtained.

Above, the light emitting device and the image display apparatus according to the invention is described based on the embodiments illustrated in the drawing. However, the invention is not limited thereto.

For example, in the light emitting device and the image display apparatus according to the invention, the configurations of each part can be replaced with an arbitrary configuration which shows similar functions. In addition, an arbitrary configuration can be added.

In addition, among the above-described embodiments, two or more embodiments may be combined. For example, the resistive element according to the fourth embodiment may be added to the light emitting device according to the first embodiment.

In addition, not limiting to the end surface light emitting type semiconductor laser, a surface light emitting type semiconductor laser can be used as the semiconductor laser. The surface light emitting type semiconductor laser has a configuration in which the resonator for resonating the light is perpendicular to the semiconductor substrate surface. The surface light emitting type semiconductor laser has high light emitting efficiency compared to the end surface light emitting type semiconductor laser. In addition, since fast modulation is possible, the surface light emitting type semiconductor laser is advantageous as a light emitting element which is used, in particular, in the image display apparatus.

The entire disclosure of Japanese Patent Application No. 2013-242535, filed Nov. 25, 2013 is expressly incorporated by reference herein.

What is claimed is:

1. A light emitting device comprising:
   a light emitting element; and
   a light variable resistive element which is connected to the light emitting element in parallel and is provided at a position which is irradiated with light emitted from the light emitting element,
   wherein the light variable resistive element has a characteristic in which a resistance value decreases as an amount of irradiation light increases, and
   wherein the light variable resistive element includes an opening portion through which a part of the light emitted from the light emitting element passes.

2. The light emitting device according to claim 1,
   wherein, among the rays of light emitted from the light emitting element, a central part of the light passes through the opening portion, and the light variable resistive element is irradiated with a peripheral part of the light.

3. The light emitting device according to claim 1,
   wherein the light variable resistive element has optical transparency.

4. The light emitting device according to claim 1, wherein the light emitting element is an edge emitting type element which emits the light from both a front end surface and a rear end surface, and
   the light variable resistive element is provided at a position which is irradiated with the light emitted from the rear end surface.

5. The light emitting device according to claim 1, further comprising:
   a detection portion which is connected to the light variable resistive element in series and detects an amount of a current which flows in the light variable resistive element.

6. The light emitting device according to claim 1, further comprising:
   a temperature variable resistive element which is connected to the light variable resistive element in parallel, is provided so that heat of the light emitting element can be conducted, and has a characteristic in which the resistance value decreases as the temperature increases.

7. An image display apparatus comprising:
   a current source; and
   the light emitting device according to claim 1.

8. An image display apparatus comprising:
   a current source; and
   the light emitting device according to claim 2.

9. An image display apparatus comprising:
   a current source; and
   the light emitting device according to claim 3.

10. An image display apparatus comprising:
    a current source; and
    the light emitting device according to claim 4.

11. An image display apparatus comprising:
    a current source; and
    the light emitting device according to claim 5.

12. An image display apparatus comprising:
    a current source; and
    the light emitting device according to claim 6.

13. The light emitting device according to claim 1, wherein the light variable resistive element is electrically connected to the light emitting element in parallel.

* * * * *